(12) United States Patent
Lee et al.

(10) Patent No.: US 8,357,554 B2
(45) Date of Patent: Jan. 22, 2013

(54) DISPLAY SUBSTRATE AND METHOD OF MANUFACTURING THE SAME

(75) Inventors: Wang-Woo Lee, Gyeonggi-do (KR); Hong-Sick Park, Gyeonggi-do (KR)

(73) Assignee: Samsung Display Co., Ltd. (KR)

( * ) Notice: Subject to any disclaimer, the term of this patent is extended or adjusted under 35 U.S.C. 154(b) by 36 days.

(21) Appl. No.: 13/156,986

(22) Filed: Jun. 9, 2011

(65) Prior Publication Data

US 2012/0132917 A1 May 31, 2012

(30) Foreign Application Priority Data

Nov. 30, 2010 (KR) .................... 10-2010-0120153

(51) Int. Cl.
*H01L 21/00* (2006.01)
(52) U.S. Cl. ........ 438/30; 438/34; 257/59; 257/E21.414
(58) Field of Classification Search ............... 438/30, 438/34, 149, 29, 151; 257/59, 72, E21.414; 349/43, 46
See application file for complete search history.

(56) References Cited

U.S. PATENT DOCUMENTS

2012/0132917 A1* 5/2012 Lee et al. ................ 257/59

* cited by examiner

*Primary Examiner* — Jack Chen
(74) *Attorney, Agent, or Firm* — Innovation Counsel LLP

(57) ABSTRACT

A display substrate having a low resistance signal line and a method of manufacturing the display substrate are provided. The display substrate includes an insulation substrate, a gate line, a data line and a pixel electrode. The gate line gate line is formed through a sub-trench and an opening portion. The sub-trench is formed in the insulation substrate and the opening portion is formed through a planarization layer on the insulation substrate at a position corresponding to the position of the sub-trench. The data line crosses the gate line. The pixel electrode is electrically connected to the gate line and the data line through a switching element. Thus, a signal line is formed through a trench formed by using a planarization layer and an insulation substrate, so that a resistance of the signal line may be reduced.

12 Claims, 8 Drawing Sheets

DISPLAY SUBSTRATE AND METHOD OF MANUFACTURING THE SAME

PRIORITY STATEMENT

This application claims priority under 35 U.S.C. §119 to Korean Patent Application No. 10-2010-0120153, filed on Nov. 30, 2010 in the Korean Intellectual Property Office (KIPO), the contents of which are herein incorporated by reference in their entirety.

BACKGROUND OF THE INVENTION

1. Field of the Invention

The present disclosure relates to a display substrate and a method of manufacturing the display substrate. More particularly, a display substrate in which a resistance of a signal line is decreased and a method of manufacturing the display substrate are provided.

2. Description of the Related Art

Generally, a liquid crystal display ("LCD") panel includes a display substrate, an opposite substrate facing the display substrate and a liquid crystal layer interposed between the display substrate and the opposite substrate. The display substrate includes a gate line formed on a base substrate to receive a gate signal, a data line crossing the gate line, a thin-film transistor connected to the gate and data lines, and a pixel electrode connected to the thin-film transistor.

As LCD panels become larger and higher resolutions are required, lengths of the gate lines and the data lines become long, so that a signal delay is generated. The signal delay may be solved by forming the gate line and/or the data line with a thicker thickness. Alternatively, a low resistance metal may be used to form the gate line and/or the data line, so that the signal delay may be overcome.

However, the types of the low resistance metal are limited. In addition, the ability to manufacture a display substrate by controlling a process so as to not change an inherent property of the low resistance metal such as aluminum (Al), copper (Cu), etc is limited. Moreover, when a thickness of a gate pattern including the gate line is increased, as a result of a step difference between the gate pattern and the base substrate, data patterns formed after the gate pattern is formed are easily cut at a side wall of the gate pattern, which can cause a short.

SUMMARY OF THE INVENTION

A display substrate having thicker gate lines that is also more stable is provided, as well as a method of manufacturing the display substrate.

According to one aspect, a display substrate includes an insulation substrate, a gate line, a data line and a pixel electrode. The gate line gate line is formed in a sub-trench and an opening portion. The sub-trench is formed in the insulation substrate and the opening portion is formed through a planarization layer on the insulation substrate at a position corresponding to the position of the sub-trench. The data line crosses the gate line. The pixel electrode is electrically connected to the gate line and the data line through a switching element.

A thickness of the gate line may be substantially equal to a summation of a depth of the sub-trench and a thickness of the planarization layer.

A first width of a first section of the gate line formed in the sub-trench may be substantially narrower than a second width of a second portion of the gate line formed through the opening portion. Alternatively, a first width of the first section of the gate line formed through the sub-trench may be substantially wider than a second width of the second section of the gate line formed through the opening portion.

According to another aspect, there is provided a method of manufacturing a display substrate. In the method, a planarization layer is formed on an insulation substrate. Then, a photoresist pattern is formed on the planarization layer. Then, the planarization layer and a portion of the insulation substrate that are exposed by the photoresist pattern are etched to form an opening portion and a sub-trench. The opening portion corresponds to the planarization layer and the sub-trench formed in the insulation substrate is in a position corresponding to the position of the opening portion. The, a gate line is formed through the opening portion and in the sub-trench. Then, a data line crossing the gate line is formed. Then, a pixel electrode electrically connected to the gate line and the data line is formed.

The sub-trench may be formed by dry-etching the planarization layer and the insulation substrate by using an etching gas. In this case, an edge portion of the sub-trench may be additionally etched by using an etching solution.

The gate line may be formed by coating a metal paste on a surface of a planarization layer having the opening portion formed thereon, which is disposed on an insulation substrate in which the sub-trench is formed, and then by blading the metal paste to insert the metal paste through the opening portion and into the sub-trench.

The photoresist pattern may be removed before the gate line is formed.

When the gate line is formed, surfaces of the gate line and the planarization layer may be partially etched. In this case, when the surfaces of the gate line and the planarization layer are partially etched, a dry-etching process may be performed.

A protection metal layer may be formed on the planarization layer before the photoresist pattern is formed, and then the protection metal layer may be wet-etched by using the photoresist pattern as an etch stop layer.

When the sub-trench is formed, the planarization layer and the insulation substrate may be etched by using the photoresist pattern and the etched metal layer as an etch stop layer. In this case, the etched protection metal layer may be removed while the surfaces of the gate line and the planarization layer are partially etched.

An inclined surface of the opening portion may be no less than about 0 degree to no more than about 30 degrees with respect to a line perpendicular to the insulation substrate.

According to a display substrate and a method of manufacturing the display substrate, a signal line is formed in a trench formed by using a planarization layer and an insulation substrate, so that a resistance of the signal line may be reduced.

Moreover, the trench is formed through the planarization layer and in the insulation substrate via a dry-etching process, so that the trench may be formed in the display substrate in a stable structure. The signal line is formed by using a metal paste and a surface of the signal line is polished to have a plan surface, so that a manufacturing reliability of patterns formed in a following process may be enhanced.

BRIEF DESCRIPTION OF THE DRAWINGS

The above and other features and advantages of the present disclosure will become more apparent by describing in detail example embodiments thereof with reference to the accompanying drawings, in which.

DETAILED DESCRIPTION OF THE INVENTION

Hereinafter, the exemplary embodiments will be explained in detail with reference to the accompanying drawings.

Figure 1:
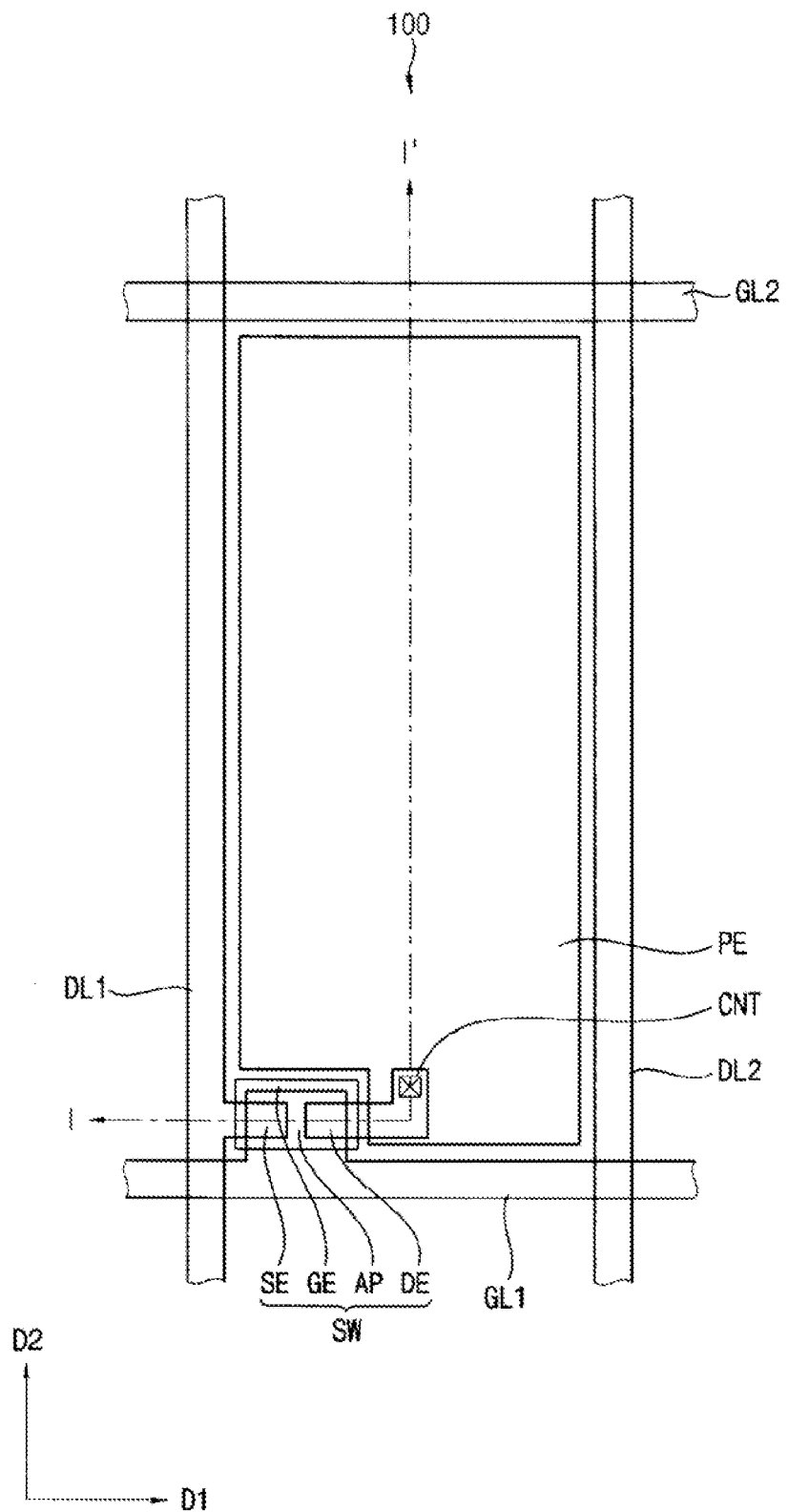
FIG. 1 is a plan view illustrating a display substrate according to one exemplary embodiment.

FIG. 1 is a plan view illustrating a display substrate according to one exemplary embodiment.

Figure 2:
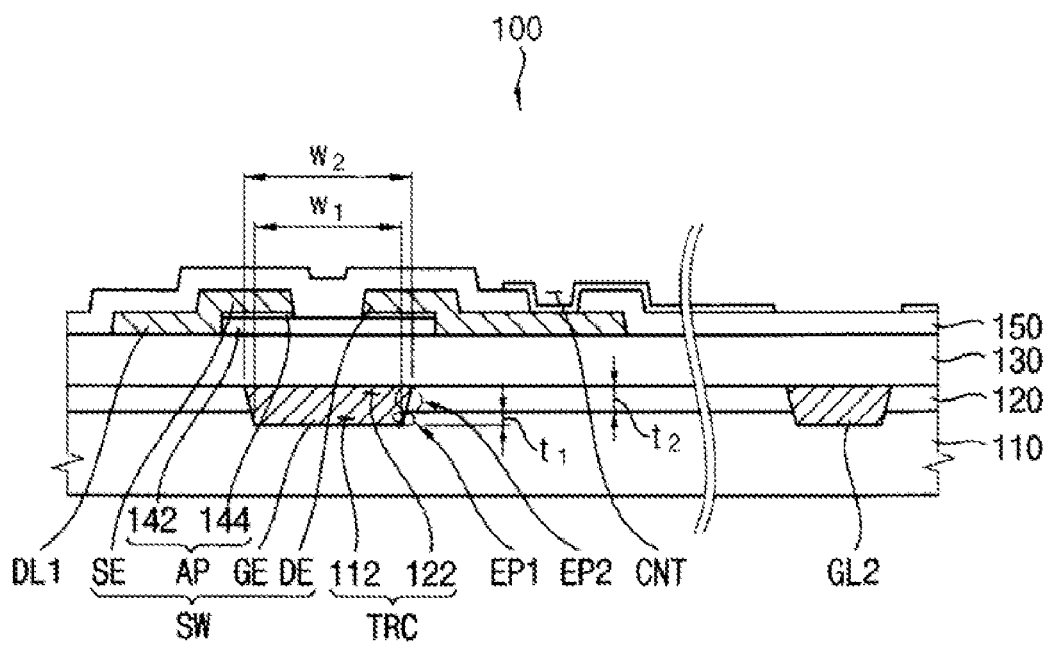
FIG. 2 is a cross-sectional view taken along a line I-I' of FIG. 1.

FIG. 2 is a cross-sectional view taken along a line I-I' of FIG. 1.

Referring to FIGS. 1 and 2, a display substrate 100 according to the present exemplary embodiment includes an insulation substrate 110, a first gate line GL1, a second gate line GL2, a first data line DL1, a second data line DL2, a thin-film transistor SW that is a switching element and a pixel electrode PE. The display substrate 100 may further include a gate insulation layer 130 and a passivation layer 150.

The insulation substrate 110 may include an optically transparent material. For example, the insulation substrate 110 may be a glass substrate.

Each of the first and second gate lines GL1 and GL2 extends along a first direction D1 to be spaced apart from each other along a second direction D2 different from the first direction D1. The second direction D2 may be substantially perpendicular to the first direction D1. The first and second gate lines GL1 and GL2, as well as the gate electrode GE, are disposed inside a main trench TRC formed in the insulation substrate 110 and a planarization layer 120. Alternatively, the features of main trench TRC are illustrated in FIG. 2 on the gate electrode GE, but apply equally to the gate lines GL1 and GL2.

The planarization layer 120 is formed on the insulation layer 110. The planarization layer 120 may include a polymer containing siloxane series silicon or a poly silane series silicon, a carbon polymer containing acrylate, novolac series resin, etc., a silicon oxide (SiOx, $0<x\leq1$), silicon nitride (SiNx, $0<x\leq1$), etc. The planarization layer 120 may be formed from a photosensitive material. Alternatively, the planarization layer 120 may be formed from a non-photosensitive material. The planarization layer 120 may be formed from a material having a high heat resistance.

The main trench TRC includes a sub-trench 112 that is formed in the insulation substrate 110, and an opening portion 122 that is formed through the planarization layer 120. For example, each of the first and second gate lines GL1 and GL2, as well gate electrode GE, may be defined as including a lower gate portion disposed in the sub-trench 112 and an upper gate portion disposed in the opening portion 122 so as to be disposed on the lower gate portion, in accordance with a position of the main trench TRC. A depth of the main trench TRC may be substantially equal to a summation of a depth 't1' of the sub-trench 112 and a depth 't2' of the opening portion 122. The depth 't2' of the opening portion 122 may be substantially equal to a thickness of the planarization layer 120. For example, each thickness of the first and second gate lines GL1 and GL2, including gate electrode GE may be substantially equal to a depth of the main trench TRC.

The amount of time required to form the sub-trench 112 having a depth equal to the depth 't2' of the opening portion 122 is greater than the amount of time required to form the opening portion 122. Thus, the depth 't1' of the sub-trench 112 may be smaller than the depth 't2' of the opening portion 122. The main trench TRC is formed by using both the insulation substrate 110 and the planarization layer 120. Because both are used, the depth of the main trench TRC is relatively deeper than a trench that would be formed only in the insulation substrate 110, or a trench that would be indirectly formed by using the planarization layer 120. Thus, the main trench TRC is formed to have a relatively deep depth, so that thicknesses of the first and second gate lines GL1 and GL2 may be greater. As a result of this greater thickness of the first and second gate lines GL1 and GL2, the wire resistances of the first and second gate lines GL1 and GL2 may be decreased.

An inclined surface EP1 of the sub-trench 112 may be disposed along the same surface as an inclined surface EP2 of the opening portion 122. The inclined surface EP1 of the sub-trench 112 is an etching surface that is defined when the insulation substrate 110 is etched to form the sub-trench 112. Moreover, the inclined surface EP2 of the opening portion 122 is an etching surface that is defined when the planarization layer 120 is etched to form the opening portion 122. The sub-trench 112 and the opening portion 122 are manufactured through a dry etching process that is anisotropic, so that the inclined surface EP1 of the sub-trench 112 is not more significantly etched than the inclined surface EP2 of the opening portion 122. Thus, the inclined surface EP1 of the sub-trench 112 may be disposed on a surface identical to the inclined surface EP2 of the opening portion 122.

A width w1 of the sub-trench 112 at a contact area between the insulation substrate 110 and a lower surface of the planarization layer 120 may be narrower than a width w2 of the opening portion 122 at an upper surface of the planarization layer 120. The width w1 of the sub-trench 112 may be defined as a distance between inclined surfaces EP1 that face each other on either side of the sub-trench 112. Moreover, the width w2 of the planarization layer 120 may be defined as a distance between inclined surfaces EP1 that face each other on either side of opening portion 122. That is, a width of the sub-trench 112 may gradually increase as it goes from a lower portion of the sub-trench 112 to an upper portion adjacent to the planarization layer 120 of the sub-trench 112. Moreover, a width of the opening portion 122 may gradually increase as it goes from a lower portion adjacent to the insulation substrate 110 of the opening portion 122 to an upper portion toward a surface of the planarization layer 120. Thus, each line width of the first and second gate lines GL1 and GL2 may gradually increase from the sub-trench 112 to the opening portion 122. At each of the first and second gate lines GL1 and GL2, a first width that is a maximum line width of the lower gate portion may be narrower than a second width that is a maximum line width of the upper gate portion.

Alternatively, the inclined surface EP1 of the sub-trench 112 and the inclined surface EP2 of the opening portion 122 may both be substantially perpendicular to a surface of the insulation substrate 110. A width w1 of the sub-trench 112 at a contact area between the insulation substrate 110 and a lower surface of the planarization layer 120 may be equal to a width w2 of the opening portion 122 at an upper surface of the planarization layer 120. In this case, a width of the first gate line GL1 and second gate line GL2 may be equal a lower portion and an upper portion of the main trench TRC.

Because the first and second gate lines GL1 and GL2 are formed in the main trench TRC, the gate insulation layer 130 may be formed on the insulation substrate 110 in which the first and second gate lines GL1 and GL2 and the planarization layer 120 are formed. Accordingly, patterns formed on the gate insulation layer 130 may be formed in a stable structure in comparison to the case in which the first and second gate lines GL1 and GL2 are formed on a top, even surface of the insulation substrate 110, such that the first and second gate lines protrude upward from the surface of the insulation substrate 110.

The first and second data lines DL1 and DL2 extend along the second direction D2 and are spaced apart from each other along the first direction D1. Thus, the first and second data lines DL1 and DL2 may cross the first and second gate lines GL1 and GL2. At a crossing portion on which the first and second data lines DL1 and DL2 cross the first and second gate lines GL1 and GL2, because the first and second data lines DL1 and DL2 are formed on the gate insulation layer 130 that is flatly formed, the first and second data lines DL1 and DL2 are not cut by the first and second gate lines GL1 and GL2 where the first and second data lines DL1 and DL2 cross the first and second gate lines GL1 and GL2.

The TFT SW is electrically connected to the first gate line GL1, the first data line DL1 and the pixel electrode PE. The TFT SW includes a gate electrode GE connected to the first gate line GL1, a source electrode SE connected to the first data line DL1, a drain electrode DE spaced apart from the source electrode SE and a semiconductor pattern AP. The semiconductor pattern AP may include a semiconductor layer 142 and an ohmic contact layer 144 formed on the semiconductor layer 142. The semiconductor layer 142 may include an amorphous silicon (a-Si), a poly silicon (poly-Si) or an oxide semiconductor.

The gate electrode GE is formed in the main trench TRC. The semiconductor pattern AP is formed on the gate insulation layer 130 formed on the gate electrode GE and the planarization layer 120. Because the gate electrode GE is formed in the main trench TRC, the gate insulation layer 130 may be flatly formed on the insulation substrate 110 so that the semiconductor pattern AP, the source electrode SE and the drain electrode DE may also be stably formed. That is, because, unlike a conventional SW TFT, there is no step difference between the insulation substrate 110 and the gate electrode GE in the embodiments, the source and drain electrodes SE and DE may be easily formed over the semiconductor pattern AP to the gate insulation layer 130. Thus, the structure of the embodiments may prevent the source and drain electrodes SE and DE from being physically cut at an end portion of the semiconductor pattern AP.

The passivation layer 150 is formed on the insulation substrate 110 including the thin-film transistor SW. A contract hole CNT exposing an end portion of the drain electrode DE is formed through the passivation layer 150. The pixel electrode PE is formed on the passivation layer 150. The pixel electrode PE makes a direct contact with the drain electrode DE through the contact hole CNT, so that the thin-film transistor SW is electrically connected to the pixel electrode PE.

FIGS. 3A to 3E are cross-sectional views showing a method of manufacturing a display substrate of FIG. 2.

Figure 3A:
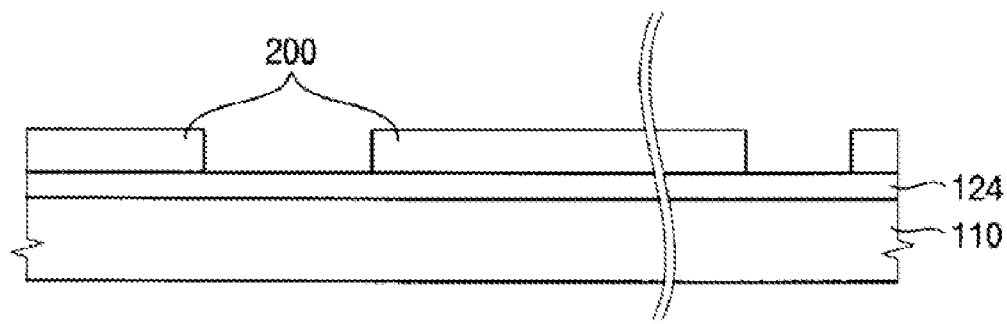
FIGS. 3A to 3E are cross-sectional views showing a method of manufacturing a display substrate of FIG. 2.

In FIG. 3A, a preliminary planarization layer that is formed on the insulation substrate 110 before the opening portion 122 is formed is represented by reference numeral "124" in order to distinguish from the planarization layer 120 having the opening portion 122 formed therethrough. Thus, the planarization layer 120 shown in FIG. 2 is substantially the same as the preliminary planarization layer 124 except that the planarization layer 120 has the opening portion 122 formed therethrough.

Referring to FIGS. 1 and 3A, the preliminary planarization layer 124 is formed on the insulation layer 110. The preliminary planarization layer 124 may include a silicon polymer or a carbon polymer. An initial thickness t3 of the preliminary planarization layer 124 may be about 1,000 [angstroms] to about 3,000 [angstroms].

Then, a photoresist pattern 200 is formed on the insulation substrate 110 on which the preliminary planarization layer 124 is formed. The photoresist pattern 200 has openings that expose the areas of the preliminary planarization layer 124 (and substrate 110) that the first and second gate lines GL1 and GL2 and the gate electrode GE will be formed through. To form the photoresist pattern 200, a photoresist composition that reacts to light differently from the composition used to form the preliminary planarization layer 124 is deposited on the insulation substrate 110 on which the preliminary planarization layer 124 is formed. The photoresist composition is then exposed and developed so that the photoresist pattern 200 may be formed.

Figure 3B:
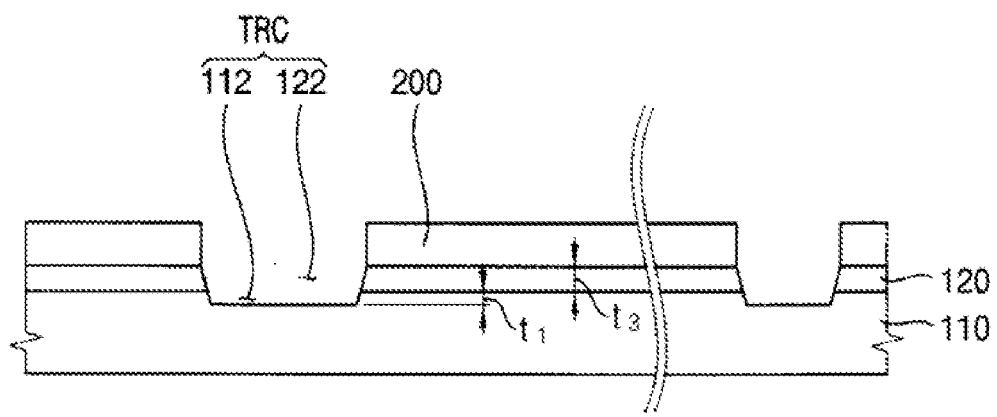

Referring to FIG. 3B, the preliminary planarization layer 124 and the insulation substrate 110 are dry-etched by using the photoresist pattern 200 as an etch stop layer. In the dry-etching process, the preliminary planarization layer 124 and the insulation substrate 110 may be etched by a same etching gas. For example, the etching gas may include a sulfur hexafluoride ($SF_6$) and an oxygen ($O_2$). Alternatively, the etching gas may include a sulfur hexafluoride ($SF_6$) and a nitrogen ($N_2$). The etching gas may easily etch the preliminary planarization layer 124 and the insulation substrate 110. However, the etching gas does not etch the photoresist pattern 200 or may only partially etch a surface of the photoresist pattern 200.

For example, the etching gas etches the preliminary planarization layer 124 exposed through the photoresist pattern 200 to form the opening portion 122 through the preliminary planarization layer 124. That is, the preliminary planarization layer 124 corresponding to the opening portion 122 is removed by the etching gas, and the preliminary planarization layer 124 formed below the photoresist pattern 200 remains on the insulation substrate 110. Because the opening portion 122 is formed through the preliminary planarization layer 124, the planarization layer 120 having the opening portion 122 formed therethrough may be defined. The etched surface of the preliminary planarization layer 124 forms an inclined surface of the opening portion 122.

Next, the etching gas etches a surface of the insulation substrate 110 that becomes exposed through the opening portion 122 of the planarization layer 120. The exposed surface of the insulation substrate 110 is partially etched by the etching gas. The etching process is continuous, so that the same etching process is used to form opening portion 122 of the planarization layer through preliminary planarization layer and then to partially etching the surface of the insulation substrate 110 exposed by opening portion 122. That is, the etching gas is continuously provided to the preliminary planarization layer 124 and to the insulation substrate 110 exposed by the preliminary planarization layer 124. The etching gas may be controlled to etch the insulation substrate 110 to have a predetermined thickness. An etching velocity of the etching gas for etching the insulation substrate 110 may be a half of an etching velocity of the etching gas for etching the preliminary planarization layer 124. An etching thickness of the insulation substrate 110 may be easily adjusted by controlling a time required to provide the etching gas. The etching thickness may be substantially equal to a depth 't1' of the sub-trench 112. Because the dry-etching process using the etching gas has etches anisotropically, only the portion of the insulation substrate 110 exposed through the opening portion 122 may be removed, while portions of the insulation substrate 110 under the planarization layer 120 are not etched. Thus, as shown in FIG. 2, the inclined surface EP1 of the sub-trench 112 may be disposed on along the same surface as the inclined surface EP2 of the opening portion 122. An etched surface of the insulation substrate 110 using the etching gas is an inclined surface EP1 of the sub-trench 112. Thus, the main trench TRC may be formed through the planarization layer 120 and the insulation substrate 110.

Because the main trench TRC is configured by using the opening portion 122 and the sub-trench 112, the process time required to form the main trench TRC may be decreased as compared to a process time required to form a trench of an equal depth formed only in the insulation substrate 110 without the planarization layer 120. Moreover, the main trench TRC is configured by using the opening portion 122 and the sub-trench 112, so that a line thickness may be increased and thus a line resistance may be decreased although a thickness of the planarization layer 120 is thinner than thicknesses of the first and second gate lines GL1 and GL2.

After the main trench TRC is formed, the photoresist pattern 200 is removed.

Figure 3C:
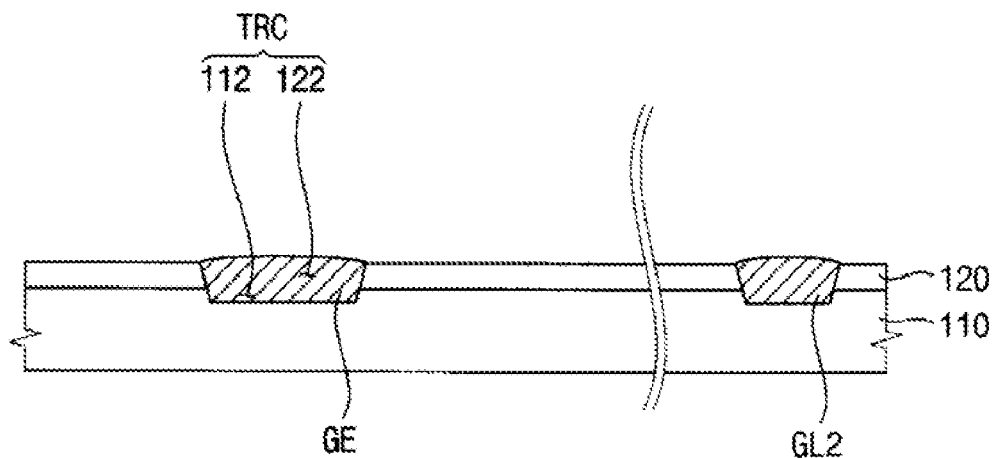

Referring to FIG. 3C, the first and second gate lines GL1 and GL2 and the gate electrode GE are formed on the insulation substrate 110 in which the main trench TRC is formed.

A metal paste fills the main trench TRC, so that the first and second gate lines GL1 and GL2 and the gate electrode GE may be formed on the main trench TRC. For example, the metal paste is deposited on the planarization layer 120 and the insulation substrate 110 in which the main trench TRC is formed and the metal paste is bladed, so that the metal paste may be inserted into the main trench TRC to fill the main trench TRC. The metal paste may include, for example, silver (Ag), copper (Cu), aluminum (Al), etc.

When the metal paste fills the main trench TRC, surfaces of the first and second gate lines GL1 and GL2 and the gate electrode GE may not be aligned with a surface of the planarization layer 120. That is, the metal paste may overflow the main trench TRC or the main trench TRC is not fully filled with the metal paste, so that the surfaces of the first and second gate lines GL1 and GL2 and the gate electrodes GE may be not disposed on a plane identical to the surface of the planarization layer 120.

Figure 3D:
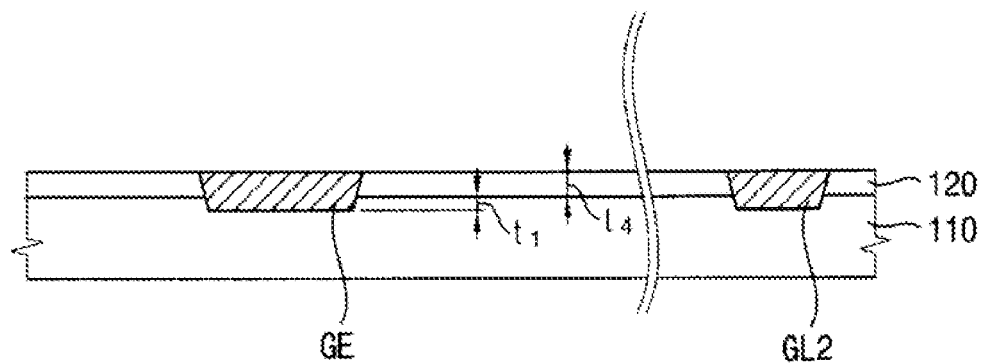

Referring to FIG. 3D, a planarizing process is performed, so that the surfaces of the first and second gate lines GL1 and GL2 and the gate electrodes GE are disposed on a plane identical to the surface of the planarization layer 120.

For example, when the surfaces of the first and second gate lines GL1 and GL2 and the gate electrode GE are relatively protruded from the surface of the planarization layer 120, a protruded portion of the first and second gate lines GL1 and GL2 and the gate electrodes GE are partially etched, so that the surfaces of the first and second gate lines GL1 and GL2 and the gate electrodes GE may be disposed on a plane identical to the surface of the planarization layer 120. The planarizing process may be performed through a dry-etching process. In such a case, a thickness t4 of the planarization layer 120 may be substantially equal to an initial thickness t3 of the preliminary planarization layer 124, and may be substantially equal to a thickness t2 of the planarization layer 120 shown in FIG. 2.

Alternatively, the planarization layer 120 is partially etched together with the first and second gate lines GL1 and GL2 and the gate electrode GE, so that a planarizing process is performed. The planarizing process may be performed through a dry-etching process. In this case, the planarization layer 120 is partially etched, so that a thickness t4 of the planarization layer 120 may be smaller than an initial thickness t3 of the preliminary planarization layer 124, and may be substantially equal to a thickness t2 of the planarization layer 120 shown in FIG. 2.

The planarization process explained in FIG. 3D may be performed or omitted in accordance with a requirement of user.

Figure 3E:
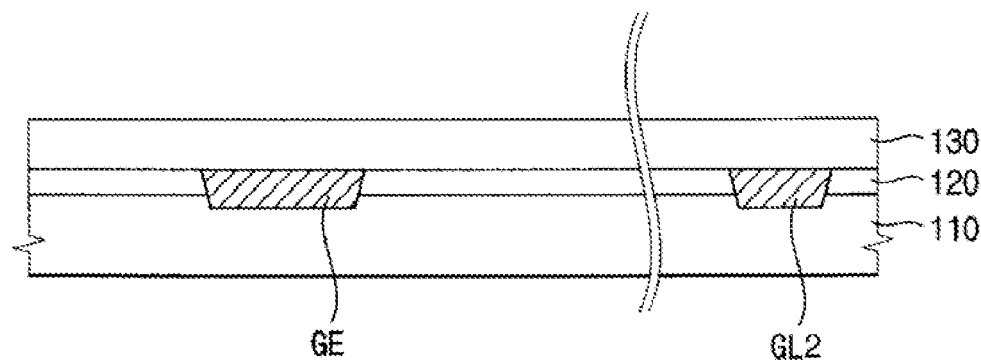

Referring to FIGS. 1 and 3E, the gate insulation layer 130 is formed on the insulation substrate 110 on which the planarization layer 120, the first and second gate lines GL1 and GL2 and the gate electrode GE are formed. The gate insulation layer 130 may make direct contact with the planarization layer 120, the first and second gate lines GL1 and GL2 and the gate electrode GE.

Then, the semiconductor pattern AP including the semiconductor layer 142 and the ohmic contact layer 144 is formed on the gate insulation layer 130, and the first and second data lines DL1 and DL2, the source electrode SE and the drain electrode DE are formed. The first and second data lines DL1 and DL2, the source electrode SE and the drain electrode DE are formed on the semiconductor pattern AP on the gate insulation layer 130, so that the first and second data lines DL1 and DL2 may be continuously formed on the first and second gate lines GL1 and GL2, and the source and drain electrodes SE and DE may be continuously formed on the semiconductor pattern AP.

The passivation layer 150 is formed on the insulation substrate 110 on which the first and second data lines DL1 and DL2, the source electrode SE and the drain electrode DE are formed. The contact hole CNT is then formed. The pixel electrode PE is formed on the passivation layer 150 having the contact hole CNT formed therethrough, so that the display substrate 100 of FIG. 2 may be manufactured.

According to the present exemplary embodiment, when the first and second gate lines GL1 and GL2 are formed in the main trench TRC formed by using the planarization layer 120 and the insulation substrate 110, a line resistance of the first and second gate lines GL1 and GL2 may be decreased. Moreover, the planarization layer 120 and the insulation substrate 110 form the main trench TRC through a dry-etching process, so that a structure of the main trench TRC may be stable. The first and second gate lines GL1 and GL2 are formed by using metal paste, and then surfaces of the first and second gate lines GL1 and GL2 are polished to perform a planarizing process, so that patterns formed in a following process, the semiconductor pattern AP and the first and second data lines DL1 and DL2 may be stably formed. Thus, reliability of the manufacturing of the display substrate 100 may be enhanced.

Hereinafter, a manufacturing method of the display substrate shown in FIGS. 1 and 2, which is different from a description of FIGS. 3A to 3E, will be explained with reference to FIGS. 4A to 4D. A planarizing process is substantially the same as a description of FIG. 3D and following steps of forming the gate insulation layer 130 are substantially the same as a description of FIG. 3D, so that a following process of FIG. 4D will be explained with reference to FIGS. 3D and 3E.

FIGS. 4A to 4D are cross-sectional views showing a method of manufacturing a display substrate according to another exemplary embodiment.

Figure 4A:
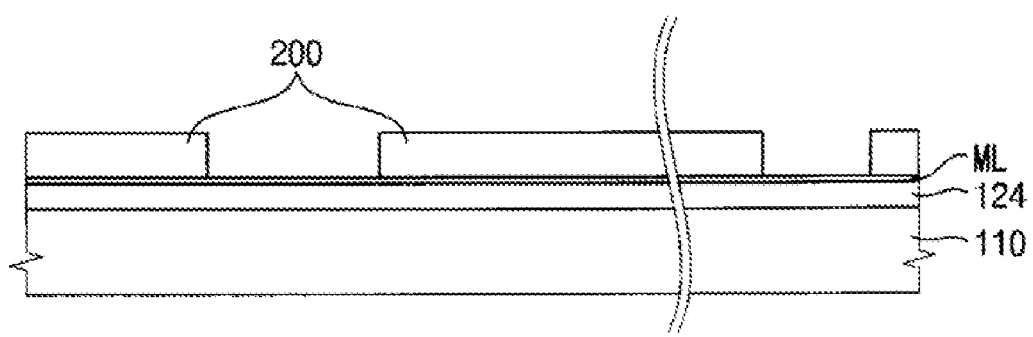
FIGS. 4A to 4D are cross-sectional views showing a method of manufacturing a display substrate according to another exemplary embodiment.

Referring to FIGS. 2 and 4A, the preliminary planarization layer 124 is formed on the insulation substrate 110, and then a protection metal layer ML is formed on a whole surface of the preliminary planarization layer 124. The photoresist pattern 200 is formed on the insulation substrate 110 on which the protection metal layer ML is formed. The photoresist pattern 200 may partially expose the protection metal layer ML.

Figure 4B:
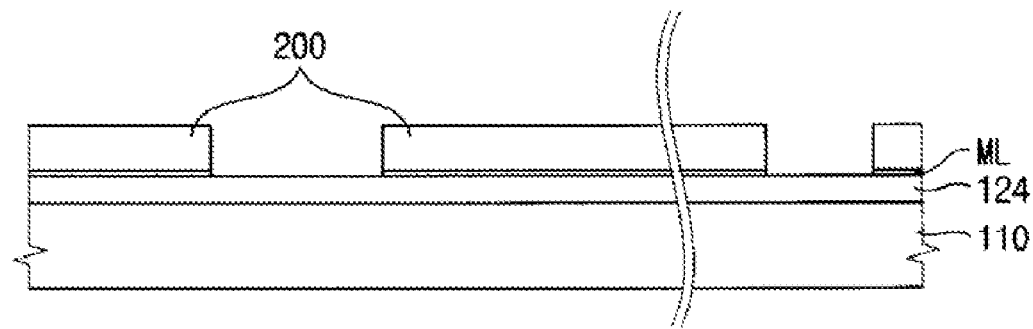

Referring to FIG. 4B, the protection metal layer ML is etched by using the photoresist pattern 200 as an etch stop layer. The protection metal layer ML may be wet-etched. The protection metal layer ML is wet-etched to expose the preliminary planarization layer 124.

Figure 4C:
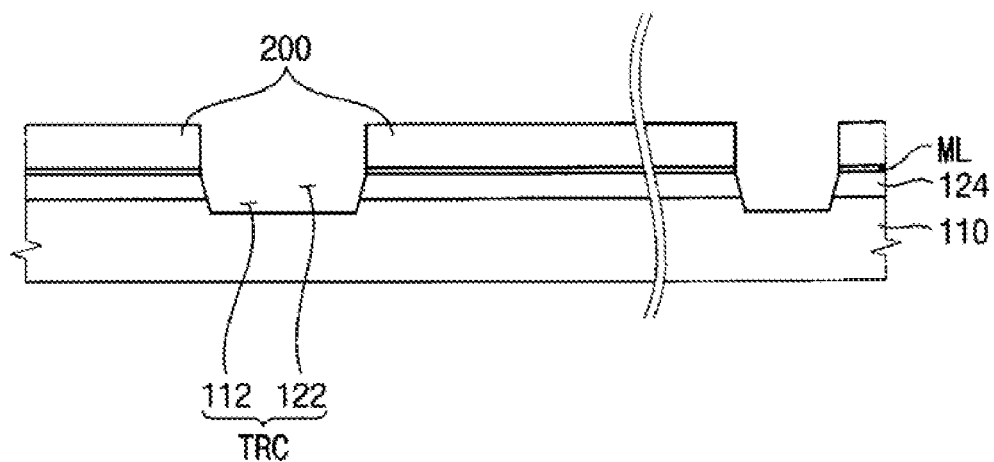

Referring to FIG. 4C, the portion of the preliminary planarization layer 124 exposed by the photoresist pattern 200 and the etched protection metal layer ML is then etched, and the insulation substrate 110 is partially etched. Thus, the planarization layer 120 having the opening portion 122 formed therethrough is formed, and the sub-trench 122 is formed. A description for FIG. 4C is substantially the same as a description for FIG. 3B except that the etched protection metal layer ML is disposed between the photoresist pattern 200 and the planarization layer 120, and thus any repetitive explanation is omitted.

When the preliminary planarization layer 124 is dry-etched by using the photoresist pattern 200 as an etch stop layer, the etched protection metal layer ML may prevent a width of the opening portion 122 from increasing. In this case, the width of the opening portion 122 may be increased when an end portion of the photoresist pattern 200 is partially removed to over-etch the preliminary planarization layer 124. That is, the etched protection metal layer ML may prevent line widths of the first and second gate lines GL1 and GL2 from becoming excessively wide.

The main trench TRC that has the sub-trench 112 and the opening portion 122 formed therethrough is formed, and then the photoresist pattern 200 is removed. The photoresist pattern 200 may be removed by using a strip solution. As the photoresist pattern 200 is removed, the protection metal layer ML may be exposed.

Figure 4D:
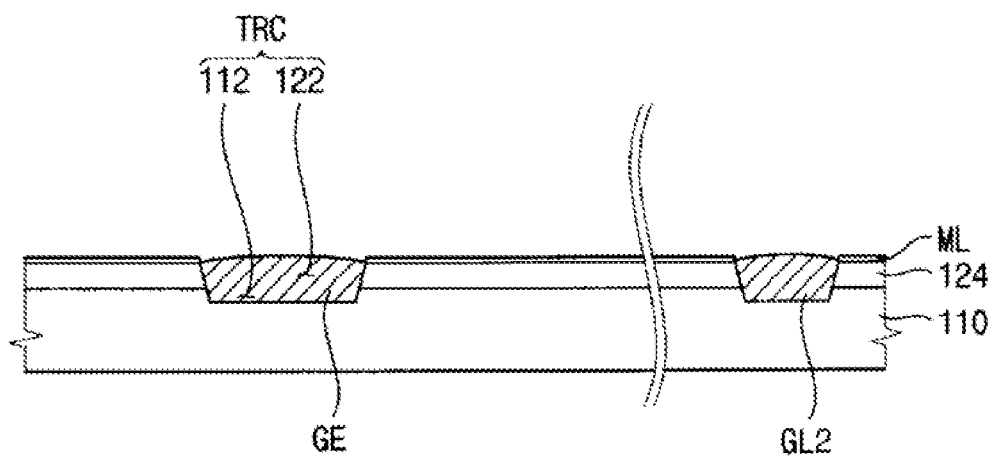

Referring to FIG. 4D, after the photoresist pattern 200 is removed, the metal paste is filled through the opening portion 122 of the planarization layer 120 and the sub-trench 112 of the insulation substrate 110. Thus, the first and second gate lines GL1 and GL2 and the gate electrode GR are formed.

Referring to FIGS. 3D and 4D, surfaces of the first and second gate lines GL1 and GL2 and the gate electrode GE formed in the main trench TRC and a surface of the planarization layer 120 are polished to perform a planarizing process. While the gate electrode GE and the first and second gate lines GL1 and GL2 are partially etched in the planarizing process, the etched protection metal layer ML is removed. After the etched protection metal layer ML is removed, the planarization layer 120 may be partially etched. The planarizing process is substantially the same as described above with reference to FIG. 3D, except that the etched protection metal layer ML is removed before the planarization layer 120 is etched, and thus any repetitive detailed explanation is omitted.

Then, the planarizing process described in FIG. 3E is performed, and then the gate insulation layer 130, the semiconductor pattern AP, the source and drain electrodes SE and DE, the first and second data lines DL1 and DL2, the passivation layer 150 and the pixel electrode PE are sequentially formed on the insulation substrate 110 on which the first and second gate lines GL1 and GL2 and the gate electrode GE are formed. Accordingly, the display substrate 100 shown in FIG. 2 may be manufactured.

In the present exemplary embodiment, the protection metal layer ML is formed between the photoresist pattern 200 and the preliminary planarization layer 124, so that the metal layer ML may prevent the photoresist pattern 200 from stripping away from the preliminary planarization layer 124, while the sub-trench 112 and the opening portion 122 are formed. The etched protection metal layer ML may be easily removed without an additional process in a surface polishing process.

Hereinafter, a display substrate according to still another exemplary embodiment will be explained with reference to FIG. 5. A plan view of the display substrate according to the present exemplary embodiment is substantially the same as the display substrate explained in FIG. 1, so that the display substrate according to the present exemplary embodiment will be explained with reference to FIGS. 1 and 5 and thus any repetitive detailed explanation will hereinafter be omitted.

Figure 5:
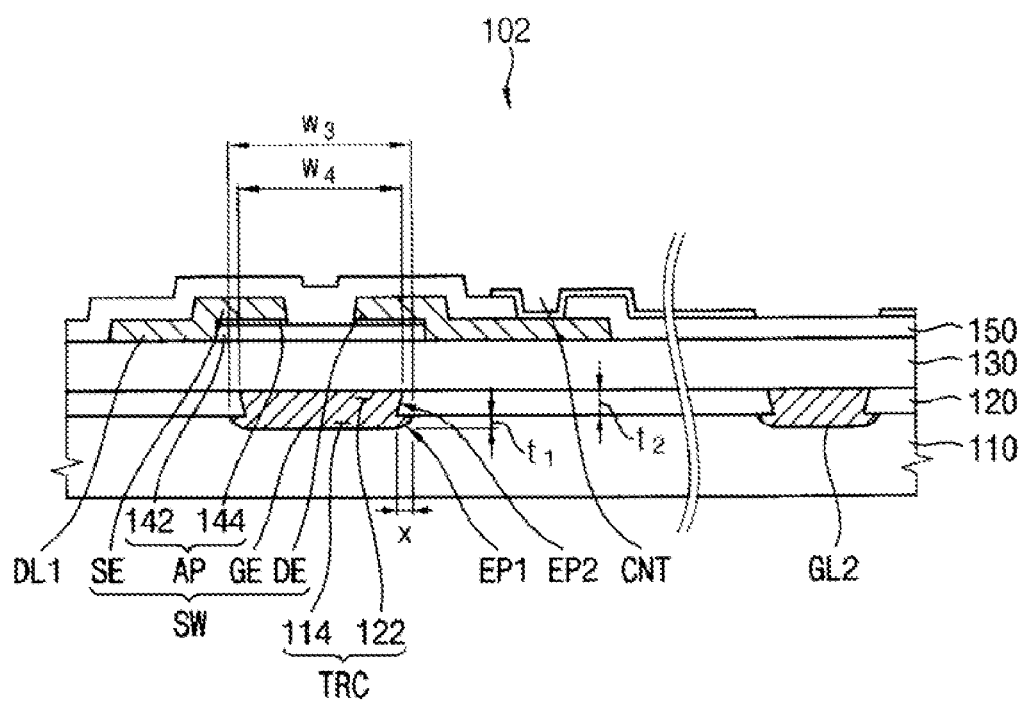
FIG. 5 is a cross-sectional view of a display substrate according to still another exemplary embodiment.

FIG. 5 is a cross-sectional view of a display substrate according to still another exemplary embodiment.

Referring to FIGS. 1 and 5, a display substrate 102 according to the present exemplary embodiment includes first and second gate lines GL1 and GL2 formed on an insulation substrate 110, first and second data lines DL1 and DL2, a thin-film transistor SW that is a switching element, and a pixel electrode PE. The display substrate 100 may further include a gate insulation layer 130 and a passivation layer 150.

The first and second gate lines GL1 and GL2 are formed in a main trench TRC formed in the insulation substrate 110 and through planarization layer 120. The planarization layer 120 is a layer formed on the insulation substrate 110. The main trench TRC includes a sub-trench 114 formed in the insulation substrate 110 and an opening portion 122 formed through the planarization layer 120. A depth of the main trench TRC may be equal to a sum of a depth 't1' of the sub-trench 114 and a depth 't2' of the opening portion 122. The thickness of the first and second gate lines GL1 and GL2 may be substantially equal to a depth of the main trench TRC, and thus the first and second gate lines GL1 and GL2 may be relatively thick, so that a line resistance of the first and second gate lines GL1 and GL2 may be decreased.

The inclined surface EP1 of the sub-trench 114 is formed in a more depressed shape in comparison with the inclined surface EP2 of the opening portion 122. For example, the inclined surface EP1 of the sub-trench 114 may be disposed below the planarization layer 120, and may be indented with respect to the inclined surface EP2. As described in more detail below with respect to FIGS. 6A-6C, the sub-trench 114 is formed together with the opening portion 122 of the planarization layer 120, and then a wet-etching process using the planarization layer 120 as an etch stop layer is further performed. As a result of this process, an edge portion of the sub-trench 114 is partially etched away underneath the planarization layer 120, so that the sub-trench 114 is more depressed than the opening portion 122. In this case, the inclined surface EP2 of the opening portion 122 may be inclined to have an angle of about 0 degree to about 30 degrees with respect to a normal line of the insulation substrate 110. The slope of the inclined surface EP2 can be adjusted so that a distance 'x' between the inside edge of inclined surface EP1 of the sub-trench 114 and the outer edge of inclined surface EP2 of the opening portion 122 may be adjusted. Accordingly, the first and second gate lines GL1 and GL2 according to the present exemplary embodiment may have a line width that is wide in comparison with the first and second gate lines GL1 and GL2 shown in FIGS. 1 and 2. However, the widths of the first and second gate lines GL1 and GL2 are equal to each other at an upper portion of the planarization layer 120 of the opening portion 122.

As the distance 'x' increases, while the widths of the first and second gate lines GL1 and GL2 are held equal at an upper portion of the planarization layer 120 of the opening portion 122, the line width of a signal line formed in the main trench TRC increases. Here, an aperture ratio may be decreased when the distance 'x' is excessively increased. For example, a width w3 of the sub-trench 114 at a contact area of a lower surface of the planarization layer 120 may be wider than a width w4 of the opening portion 122 at an upper surface of the planarization layer 120. That is, a maximum width w4 of the opening portion 122 may be smaller than a maximum width w3 of the sub-trench 114. A difference between the width w3 of the sub-trench 114 and the width w4 of the opening portion 122 may be a twice of the distance x. In each of the first and second gate lines GL1 and GL2, a maximum line width of a lower gate portion formed in the sub-trench 114 may be relatively greater than a maximum line width of an upper gate portion formed through the opening portion 122 to be disposed on the lower gate portion.

Because the first and second gate lines GL1 and GL2 are formed in the main trench TRC, the gate insulation layer 130 may be formed on the insulation substrate 110 on which the first and second gate lines GL1 and GL2 and the planarization layer 120 are formed. Moreover, at a crossing portion on which the first and second data lines DL1 and DL2 cross the first and second gate lines GL1 and GL2, because the first and second data lines DL1 and DL2 are formed on the gate insulation layer 130 that is flatly formed, the first and second data lines DL1 and DL2 are not cut by the first and second gate lines GL1 and GL2 where the first and second data lines DL1 and DL2 cross the first and second gate lines GL1 and GL2.

The thin-film transistor SW is substantially the same as the thin-film transistor SW explained in FIGS. 1 and 2 except that a gate electrode GE connected to the first gate line GL1 is formed in a main trench TRC having a shape different from the main trench TRC of FIG. 2. Moreover, the passivation layer 150 and the pixel electrode PE are substantially the same as those explained in FIGS. 1 and 2. Thus, any repetitive explanation will hereinafter be omitted.

Figure 6A:
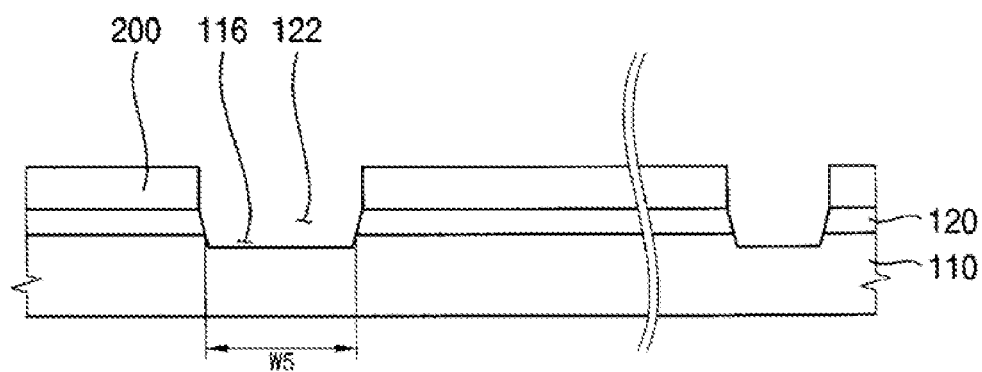
FIGS. 6A to 6C are cross-sectional views showing a method of manufacturing a display substrate of FIG. 5.
Figure 6B:
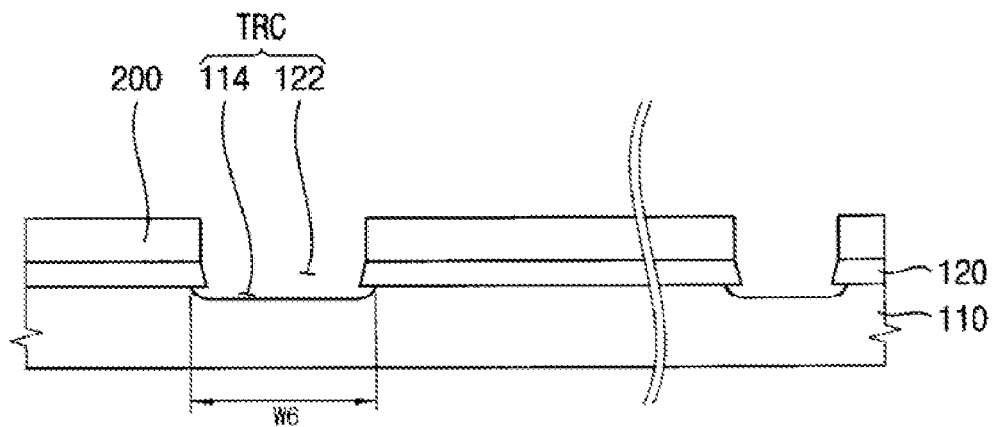
Figure 6C:
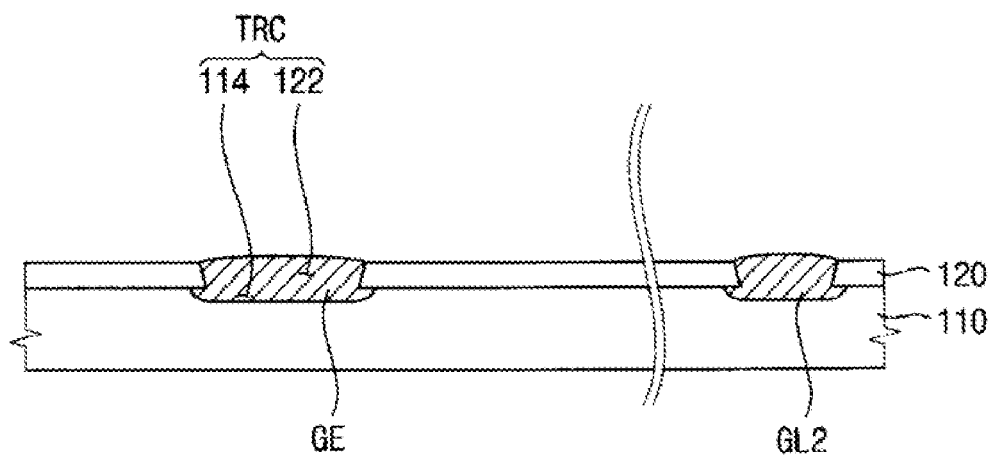

FIGS. 6A to 6C are cross-sectional views showing a method of manufacturing a display substrate of FIG. 5.

Referring to FIGS. 5 and 6A, a non-photosensitive preliminary planarization layer 124 (refer to FIG. 3A) and a photoresist pattern 200 (refer to FIG. 3A) are sequentially formed on the insulation substrate 110, and then the preliminary planarization layer 124 and the insulation substrate 110 are dry-etched by using the photoresist pattern 200 as an etch stop layer. Thus, the planarization layer 120 having the opening portion 122 formed therethrough is formed, and a preliminary trench 116 may be formed in the insulation substrate 110. In the dry-etching process, the preliminary planarization layer 124 and the insulation substrate 110 may be etched with the same etching gas. For example, the etching gas may include a sulfur hexafluoride ($SF_6$) and an oxygen ($O_2$).

The sub-trench 114 is formed by using the preliminary trench 116. The preliminary trench 116 may be substantially identical to the sub-trench 112 formed in the insulation substrate 110 by a dry-etching process in FIG. 3B. Thus, detailed descriptions thereof will hereinafter be omitted.

A width 'w5' of the preliminary trench 116, which corresponds to a contact portion between the insulation substrate 110 and a lower surface of the planarization layer 120, may be narrower than a width of the opening portion 122 corresponding to an upper surface of the planarization layer 120.

Referring to FIG. 6B, after the opening portion 122 is formed through the planarization layer 120 and then the preliminary trench 116 is formed in the insulation substrate 110, the insulation substrate 110 is partially wet-etched. In this case, the planarization layer 120 and the photoresist pattern 200 are not etched by the etching solution.

Because the wet-etching is isotropic, an edge portion of the preliminary trench 116 is partially etched through an etching solution in a predetermined width 'x' to form the sub-trench 14 shown in FIG. 5. A width 'w6' of the sub-trench 114 is wider than a width 'w5' of the preliminary trench 116 at a contact area between the insulation substrate 110 and a lower surface of the planarization layer 120, and is wider than a width of the opening portion 122 at an upper surface of the planarization layer 120. Thus, the main trench TRC may be formed.

After the main trench TRC is formed, the photoresist pattern 200 is removed by using a stripping solution.

Referring to FIG. 6C, the gate electrode GE and the first and second gate line GL1 and GL2 are formed in the main trench TRC by using a metal paste. Then, a surface planarizing process is performed by using a dry-etching process, and then the gate insulation layer 130 is formed. The surface planarizing process performed here is substantially identical to the process described above with reference to FIG. 3D. In addition, the process for forming the gate insulation layer 130 and following processes are substantially identical to those explained in reference to FIG. 3E. Thus, any repetitive explanation will hereinafter be omitted. Accordingly, the display substrate 102 shown in FIG. 5 may be manufactured.

According to the present exemplary embodiment, the first and second gate lines GL1 and GL2 are formed in the main trench TRC, which is formed by using the planarization layer 120 and the insulation substrate 110, and a line resistance of the first and second gate lines GL1 and GL2 may be decreased. Moreover, a process of partially wet-etching the insulation substrate 110 in a process of forming the main trench TRC is further performed, so that a wider signal line may be formed as compared to the first and second gate lines GL1 and GL2 shown in FIGS. 1 and 2.

As described above in detail, a display substrate and a method of manufacturing the display substrate according to the present disclosure are employed to a large-scaled size and a high resolution display device, so that a signal delay may be prevented. Moreover, a trench may be formed in the display substrate in a stable structure, and a manufacturing reliability of patterns formed in a following process may be enhanced.

The foregoing is illustrative of the present disclosure and is not to be construed as limiting thereof. Although a few example embodiments have been described, those skilled in the art will readily appreciate that many modifications are possible in the example embodiments without materially departing from the novel teachings and advantages herein. Accordingly, all such modifications are intended to be included within the scope of the present disclosure including the claims. Therefore, it is to be understood that the foregoing is illustrative and is not to be construed as limited to the specific example embodiments disclosed, and that modifications to the disclosed example embodiments, as well as other example embodiments, are intended to be included within the scope of the appended claims.

What is claimed is:

1. A method of manufacturing a display substrate, the method comprising:
    forming a planarization layer on an insulation substrate;
    forming a photoresist pattern on the planarization layer;
    etching the planarization layer and a portion of the insulation substrate that are exposed by the photoresist pattern to form an opening portion and a sub-trench, the opening portion corresponding to the planarization layer and the sub-trench formed in the insulation substrate at a position corresponding to a position of the opening portion;

forming a gate line through the opening portion and the sub-trench;

forming a data line crossing the gate line; and forming a pixel electrode electrically connected to the gate line and the data line.

2. The method of claim 1, wherein forming the sub-trench comprises:

dry-etching the planarization layer and the insulation substrate by using an etching gas.

3. The method of claim 2, wherein forming the sub-trench further comprises:

etching an edge portion of the sub-trench by using an etching solution.

4. The method of claim 1, wherein forming the gate line comprises:

coating a metal paste on a surface of a planarization layer having the opening portion formed thereon, which is disposed on an insulation substrate in which the sub-trench is formed; and blading the metal paste to insert the metal paste through the opening portion and the sub-trench.

5. The method of claim 4, wherein the photoresist pattern is removed before the gate line is formed.

6. The method of claim 1, wherein forming the gate line further comprises:

partially etching surfaces of the gate line and the planarization layer.

7. The method of claim 6, wherein partially etching the surfaces of the gate line and the planarization layer is performed by a dry-etching process.

8. The method of claim 6, further comprising:

forming a protection metal layer on the planarization layer before the photoresist pattern is formed; and wet-etching the protection metal layer by using the photoresist pattern as an etch stop layer.

9. The method of claim 8, wherein forming the sub-trench comprises:

etching the planarization layer and the insulation substrate by using the photoresist pattern and the etched metal layer as an etch stop layer.

10. The method of claim 9, wherein the etched protection metal layer is removed while the surfaces of the gate line and the planarization layer are partially etched.

11. The method of claim 1, wherein an inclined surface of the opening portion is no less than about 0 degree to no more than about 30 degrees with respect to a normal of the surface of the planarization layer.

12. The method of claim 1, further comprising:

forming a gate insulation layer making a direct contact with the gate line and the planarization layer, respectively, before the data line is formed.

* * * * *